United States Patent [19]

Zommer et al.

[11] Patent Number: 5,049,961
[45] Date of Patent: Sep. 17, 1991

[54] MONOLITHIC TEMPERATURE SENSING DEVICE

[75] Inventors: Nathan Zommer, Los Altos; Mark B. Barron, Danville, both of Calif.

[73] Assignee: Ixys Corporation, San Jose, Calif.

[21] Appl. No.: 295,956

[22] Filed: Jan. 10, 1989

[51] Int. Cl.$^5$ ............................................. H01L 23/58
[52] U.S. Cl. .................................. 357/28; 357/23.4; 357/23.8; 357/20; 357/41
[58] Field of Search ................... 357/13, 20, 23.4, 28, 357/52, 23.8, 12, 23.14, 41

[56] References Cited

U.S. PATENT DOCUMENTS

| | | | |
|---|---|---|---|
| 4,602,266 | 7/1986 | Coe | 357/23.8 |
| 4,672,407 | 6/1987 | Nakagawa | 357/23.4 |
| 4,833,509 | 5/1989 | Hickox et al. | 357/13 |
| 4,896,196 | 1/1990 | Blanchard et al. | 357/28 |
| 4,896,199 | 1/1990 | Tsuzuki et al. | 357/28 |

OTHER PUBLICATIONS

"Applications of Analog Integrated Circuits", Soclof, S., Prentice Hall (1985), pp. 273-284.
Pending patent application serial No. 223,059, filed Jul. 22, 1988, titled "High Power Transistor with Voltage, Current, Power, Resistance, and Temperature Sensing Capability", Inventor: Nathan Zommer.
"An Improved MOS Insulated Gate Transistor that Handles 800V, 50A", Nathan Zommer, Gene Chen, and Dr. Mark Barron, PCIM, Jan. 1987, pp. 24-30.

Primary Examiner—Andrew J. James
Assistant Examiner—Courtney A. Bowers
Attorney, Agent, or Firm—Townsend and Townsend

[57] ABSTRACT

A semiconductor diode monolithically integrated onto a power MOS transistor or power IGBT for temperature sensing. With the application of a positive bias and a constant current, the diode provides a voltage that varies linearly as a function of temperature for the power transistor. The diode is constructed in such a manner so as to prevent latch-up (i.e. where a parasite silicon controlled rectifiers is turned on, locking the power transistor in an on condition) and voltage breakdown (i.e. where the diode malfunctions from excessive voltage).

9 Claims, 5 Drawing Sheets

MONOLITHIC TEMPERATURE SENSING DEVICE

FIELD OF THE INVENTION

This invention relates to temperature sensing of a power transistor and more particularly to a monolithic temperature sensing element integrated with a power MOS transistor or a power IGBT (insulated gate bipolar transistor).

BACKGROUND OF THE INVENTION

Most failures of power transistors in electronic circuits are due to overheating caused by excessive current. Thus, the incorporation of temperature sensing improves the overall reliability of a power electronics system. If a power transistor starts operating at an excessive temperature, a temperature sensor detects that excessive temperature, and sends a signal to a control circuit. The control circuit then turns off the power transistor or decreases its current load. However, in order to be effective, such temperature sensors must be accurate and quick to respond to changes in temperature. Otherwise, the power transistor could fail before the excess temperature is detected and corrective action taken.

Crude mechanical thermostats are sometimes attached to the heat sink of a power transistor in order to sense temperature. However, such mechanical thermostats are not reliable and do not easily interface with control circuits.

Electronic temperature sensors are often glued or attached to the heat sink or package of the power transistor. Such external temperatures sensors are not in close proximity to the power transistor, and thus there is a significant delay between the temperature rise in the power transistor and the sensors detection of that temperature rise. As a result, power transistors might fail before the excessive temperature is detected.

Sometimes temperature sensors are inserted inside the power transistor package. However, most inserted temperature sensors require at least three external leads for power and control signals. Therefore, a package with at least six leads must be used to enclose the power transistor with three leads and the temperature sensor with at least three leads. However, although three lead and five lead packages are standard packages, hence inexpensive, six lead packages are not standard packages and must be special ordered at a higher cost. In addition to the packaging problem, there is still a significant delay between the rise of temperature in the power transistor and the sensor's detection of that temperature rise.

Another type of temperature sensor called a PTAT (Proportional To the Absolute Temperature) is sometimes monolithically integrated with the power device. PTATs are temperature sensitive semiconductor circuits that generate a voltage or current that is proportional to the absolute temperature. Because of this relationship, fewer external components are needed in the control circuits to sense temperature, and the control circuits can more easily determine what the power transistors actual temperature is. Therefore, the control circuits can better determine the appropriate corrective action to follow in order to protect the power transistor. Because they are monolithically integrated with the power transistor, PTATs are quicker to detect changes in the power transistor temperature. In addition, they only require two leads out of the power transistor package. However, PTATs are not capable of detecting temperature in high voltage power transistors. If the power transistor handles more than 20 volts, the PTAT suffers from voltage breakdown and ceases functioning properly. Therefore, PTATs cannot be used to detect temperature in most power transistors. PTATs are described in greater detail in Soclof, S., "Applications of Analog Integrated Circuits", Prentice Hall (1985) pp. 273-284.

Power MOSFETs have an on-resistance that varies linearly with temperature. Copending Application Serial No. 223,059, filed July 22, 1988 and titled HIGH POWER MOS TRANSISTOR WITH VOLTAGE, TEMPERATURE, CURRENT, AND POWER SENSING CAPABILITY discloses a technique for monitoring device temperature using current mirrors. However, this technique is not effective with IGBTs which do not exhibit similar linear behavior with respect to temperature.

SUMMARY OF THE INVENTION

This invention relates to a semiconductor diode monolithically integrated onto a power MOS transistor or power IGBT for temperature sensing. With the application of a positive bias and a constant current, the diode provides a voltage that varies linearly with the temperature of the power transistor. The diode is constructed in such a manner as to prevent latch-up (i.e., where a parasitic silicon controlled rectifier is turned on, locking the power transistor in an on condition) and voltage breakdown (i.e., where the diode malfunctions from excessive voltage). In addition, the diode requires only one external lead in the power transistor package. Therefore, a standard five lead package may be used to enclose both the power transistor and the diode.

In a preferred embodiment of the invention, both poles of the diode are buried in an epitaxial layer of the power MOS transistor or power IGBT. The first pole of the diode contains a heavily doped region to prevent latch-up. The second pole of the diode is electrically connected to the source of the power transistor to prevent the diode from having an electrical potential different from the nearby source. This connection helps prevent voltage breakdown and it has the added advantage of reducing the number of required external leads for the diode to one.

The control circuit is connected to the second pole of the diode through the external lead for the source of the power transistor and the control circuit is connected to the first pole of the diode through a separate external lead. The control circuit provides the forward bias across the diode and constant current through the diode. The control circuit determines the temperature of the power transistor from the forward voltage across the diode. As a result of the construction and connections of the diode, the temperature sensor is able to function whether the power transistor is on or off.

Because the diode is located on the power transistor, the temperature sensor responds quickly to changes in temperature. Therefore, the control circuitry can take corrective action before the power transistor is damaged by the excessive temperature. Because the diode is isolated from the drain, it can stand the high voltages of a power transistor. In addition, the diode functions at a high enough voltage level to (250 to 800 millivolts) overcome noise interference from the power transistor.

In an alternative embodiment of the invention, the first pole of the diode is buried in the epitaxial layer of the power MOS transistor. The epitaxial layer or drain of the transistor acts as the second pole of the diode. As a result, there is no parasitic SCR created by the diode to cause latch-up, and only one external pin is required. However, this diode only functions when the transistor is on and the diode is susceptible to voltage breakdown at high voltages.

Due to temperature gradients across the power transistor, a single diode may not accurately detect the potential failure of the power transistor. Multiple diodes may be used to detect the hottest point on the power transistor. By connecting the diodes in parallel, only one external lead will be required. In addition, the hottest diode will have the lowest forward voltage. As a result, it will draw the most current, reducing the voltage across the remaining diodes. Therefore, the control circuit will sense the diode detecting the hottest temperature.

For a further understanding of the nature and advantages of the invention, reference should be had to the ensuing detail description taken in conjunction with the accompanying drawings.

DETAILED DESCRIPTION OF THE PREFERRED EMBODIMENTS

Figure 1:
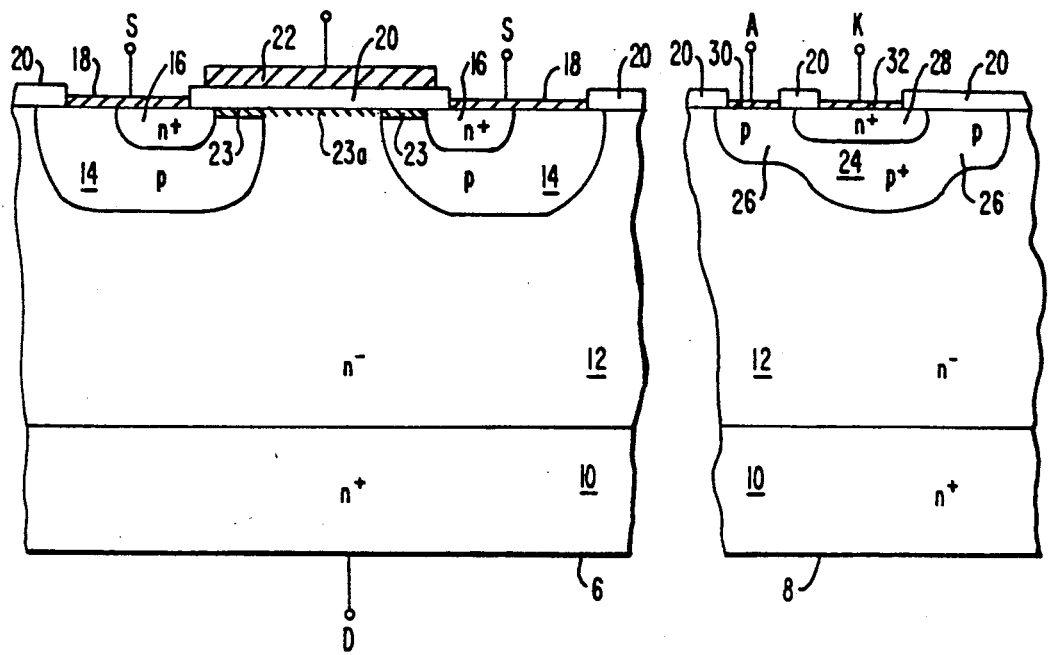
FIG. 1 shows an n channel power MOS transistor with a preferred temperature sensing diode.

FIG. 1 shows an n channel power MOS transistor (sometimes referred to simply as a "MOS") 6 with a preferred temperature sensing diode 8. MOS 6 and diode 8 have an n+ conductivity type substrate 10. Overlying the substrate is an n− conductivity type epitaxial layer 12 which acts as the drain of the device. The MOS has a p type channel region 14 surrounding an n+ type source 16. An external connection to source 16 is accomplished with an aluminum connection 18. A silicon dioxide layer 20 separates an aluminum gate 22 from the channel region 14. When the gate is turned ON, a channel layer 23 and an accumulation layer 23a are created, resulting in the power MOS transistor being turned ON.

Diode 8 has a deep p+ type anode region 24 that is encircled by a shallow p type anode region 26. Within the anode is an n+ type cathode region 28. Overlying the anode and cathode are respective connections 30 and 32.

This diode can be utilized for power MOS transistors because the diode is electrically isolated from the drain by a reverse pn junction where epitaxial layer 12 and anode 24/26 meet. When the power MOS is in the OFF condition, the drain holds the high voltage (100 to 1000 volts) of the particular application. Therefore, the diode is not exposed to the high drain voltage and does not suffer from voltage breakdown as a result of the drain voltage.

Figure 2:
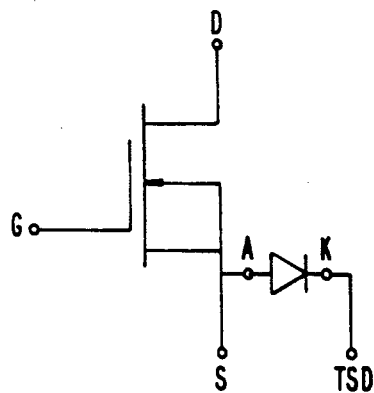
FIG. 2 shows the equivalent circuit symbols for the transistor and the diode, as shown in FIG. 1, with preferred circuit connections.

FIG. 2 shows the equivalent circuit symbols for the transistor and the diode, as shown in FIG. 1, with preferred circuit connections. The anode of the diode is connected to the source of the n channel MOS transistor. This keeps the diode from developing a voltage potential substantially different from the source, thereby preventing voltage breakdown. In addition, only four external leads are needed in order to run the power MOS and the temperature sensing diode simultaneously. Furthermore, external control circuitry can connect to the anode of the diode by simply connecting to the external source lead.

This anode/source connection also helps prevent two parasitic SCRs (see 28, 24/26, 12, 14 and 24/26, 12, 14, 16 of FIG. 1) from entering a latch-up condition. In addition, the anode contains p+ region 24 to quench the gain of one of the parasitic SCRs (see 28, 24/26, 12, 14 of FIG. 1) in order to prevent latch-up.

Figure 2A:
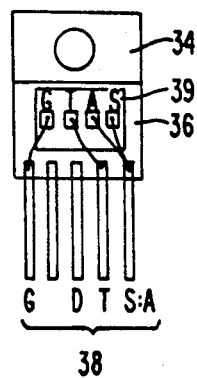
FIG. 2A shows the preferred package for the embodiments as described in FIGS. 1 and 2.

FIG. 2A shows the preferred package for the embodiments as described in FIGS. 1 and 2. The package is comprised of a heat sink 34 and a body 36 with external leads 38. The power chip 39 holding the power MOS and the diode is contained in the body of the package.

In the preferred embodiment, the anode is connected to the source with a Kelvin connection. That is, a wire is bonded from the anode to the source pin of the package. If the anode was connected directly to the source of the power MOS chip, a voltage drop on the resistive wire from the source pin to the source pad would introduce errors in the temperature sensing diode. These errors would be greatest when high currents are passed through the power MOS, thereby lessening the accuracy of the diode under conditions when it is most needed. The Kelvin connection will bypass much of the voltage drop which occurs between the source and the source pin.

The temperature sensing diode described in FIGS. 1, 2, and 2A could also be applied to a p channel power MOS transistor. Both the MOS transistor and the diode would be manufactured in a complementary manner (p type regions replaced by n type regions and the vice versa). The same preferred connections would retained for each region, that is, the source would be connected to the cathode (with a Kelvin connection) instead of the anode.

As a result of these applications, the temperature sensing diode can be utilized as a temperature sensing device for all presently existing MOS transistors. In addition, the diode can be constructed with the MOS transistor without requiring any additional masking steps.

Figure 3:
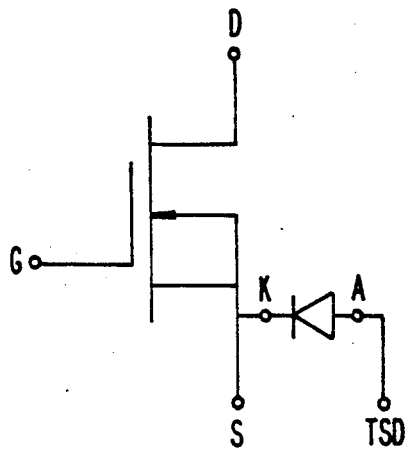
FIG. 3 shows the equivalent circuit symbols for the transistor and the diode, as shown in FIG. 1, with alternative circuit connections.

FIG. 3 shows the equivalent circuit symbols for the transistor and the diode, as shown in FIG. 1, with alternative circuit connections. In this alternative embodiment, which may be preferable in some circumstances, the source of an n channel power MOS is connected to the cathode instead of the anode. In addition, the source of a p channel power MOS is connected to the anode instead of the cathode.

Figure 3A:
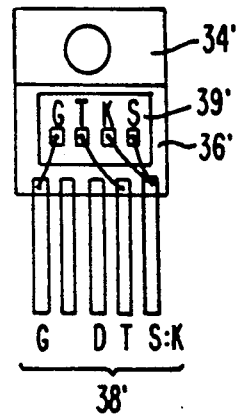
FIG. 3A shows the preferred package for the embodiments as described in FIGS. 1 and 3.

FIG. 3A shows the preferred package for the embodiments as described in FIGS. 1 and 3. Primed reference numerals are used for elements that correspond to those in FIG. 2A.

Figure 4:
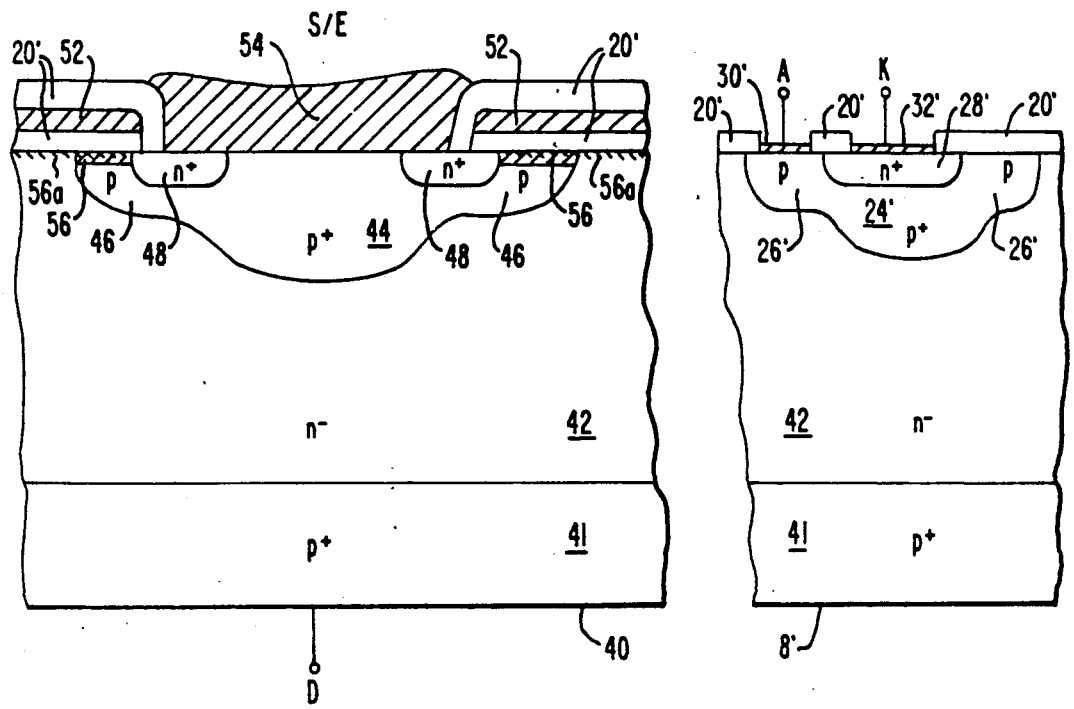
FIG. 4 shows an n channel IGBT with a preferred temperature sensing diode.

FIG. 4 shows an n channel IGBT 37 with a preferred temperature sensing diode 8'. Primed reference numerals are used for elements that correspond to those in FIG. 1. Both IGBT 37 and diode 8' have a p+ type substrate 40. Other than the different substrate, the diode shown here is identical to the one shown in FIG. 1. The substrate acts as the collector of the IGBT. Overlying the substrate is an n− type epitaxial layer 42 which acts as the drain of the inherent MOS and as the base of the inherent BJT. Buried in the epitaxial layer is a p+ type region 44 which acts as the emitter of the BJT. Encircling the p+ region is a p type region 46 which acts as the emitter of the BJT and as the channel for the MOS. Buried in the emitter region is an n+ type region 48 which acts as the source of the inherent MOS. Overlying the channel region are silicon dioxide layers 20' and aluminum gates 52. Also overlying the structure is a source/emitter aluminum connection 54. As the gates 52 are turned ON accumulation layer 56 is created, resulting in the IGBT being turned ON.

As with the MOS transistor, this diode can be utilized for power IGBT transistors because the diode is electrically isolated from the drain by a reverse pn junction. When the power IGBT is in the OFF condition, the drain holds the high voltage (100 to 1000 volts) of the particular application. Therefore, the diode is not exposed to the high voltage and does not suffer from voltage breakdown as a result.

Figure 5:
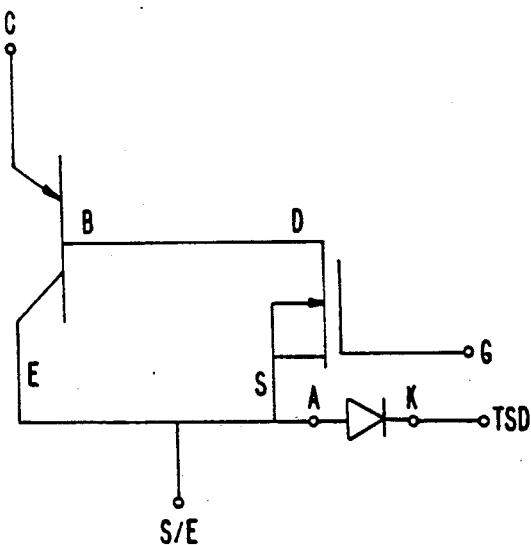
FIG. 5 shows the equivalent circuit symbols for the transistor and the diode, as shown in FIG. 4, with preferred circuit connections.

FIG. 5 shows the equivalent circuit symbols for the transistor and the diode, as shown in FIG. 4, with preferred circuit connections. An npn BJT is connected to an n channel MOS device. The base of the BJT is connected to the drain of the MOS and the emitter of the BJT is connected to the source of the MOS. In addition, diode is shown with the anode connected to the source of the power MOS. This keeps the diode from developing a voltage potential substantially different from the source/emitter, thereby preventing voltage breakdown.

In addition, only four external leads are needed in order to run the power IGBT and the temperature sensing diode simultaneously. Furthermore, external control circuitry can connect to the anode of the diode by simply connecting to the external source/emitter lead.

This anode/source connection also helps prevent two parasitic SCRs (28', 24'/26', 42, 44/46 and 24'/26', 42, 44/46, 48) from entering a latch-up condition. In addition, the anode contains the p+ region 24' to quench the gain of two of the parasitic SCRs (28', 24'/26', 42, 44/46 and 28', 24'/26', 42, 40) in order to prevent latch-up.

Figure 5A:
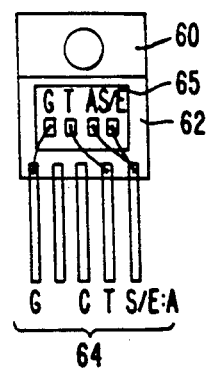
FIG. 5A shows the preferred package for the embodiments described in FIGS. 4 and 5.

FIG. 5A shows the preferred package for the embodiments described in FIGS. 4 and 5. The package is comprised of a heat sink 60 and a body 62 with external leads 64. The power chip 65 holding the power IGBT and the diode is contained in the body of the package.

In the preferred embodiment, the anode is connected to the source/emitter with a Kelvin connection. As with the MOS, the Kelvin connection bypasses the voltage drop on the resistive wire from the source/emitter pin to the source/emitter thereby decreasing errors in the temperature sensing diode.

The temperature sensing diode of FIGS. 4, 5, and 5A could also be applied to a p channel power IGBT. As described above with a p channel MOS, both the IGBT and the diode would be manufactured in a complementary manner and the source/emitter would be connected to the cathode (with a Kelvin connection) instead of the anode.

As a result of these applications, the diode can be utilized as a temperature sensing device for all presently existing IGBTs. In addition, the diode can be constructed with the IGBT without requiring any additional masking steps.

Figure 6:
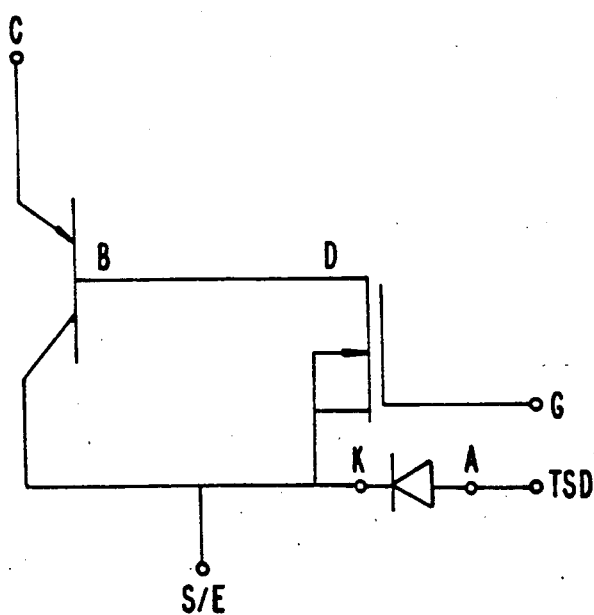
FIG. 6 shows the equivalent circuit symbols for the transistor and the diode, as shown in FIG. 1, with alternative circuit connections.

FIG. 6 shows the equivalent circuit symbols for the transistor and the diode, as shown in FIG. 1, with alternative circuit connections. In this alternative embodiment, which may be preferable in some circumstances, the source/emitter of an n channel power IGBT is connected to the cathode instead of the anode. In addition, the source/emitter of a p channel power IGBT is connected to the anode instead of the cathode.

Figure 6A:
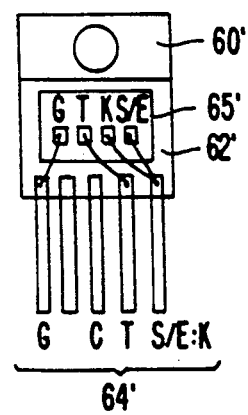
FIG. 6A shows the preferred package for the embodiments as described in FIGS. 1 and 3.

FIG. 6A shows the preferred package for the embodiments as described in FIGS. 1 and 3. Primed reference numerals are used for elements that correspond to those in FIG. 5A.

Figure 7:
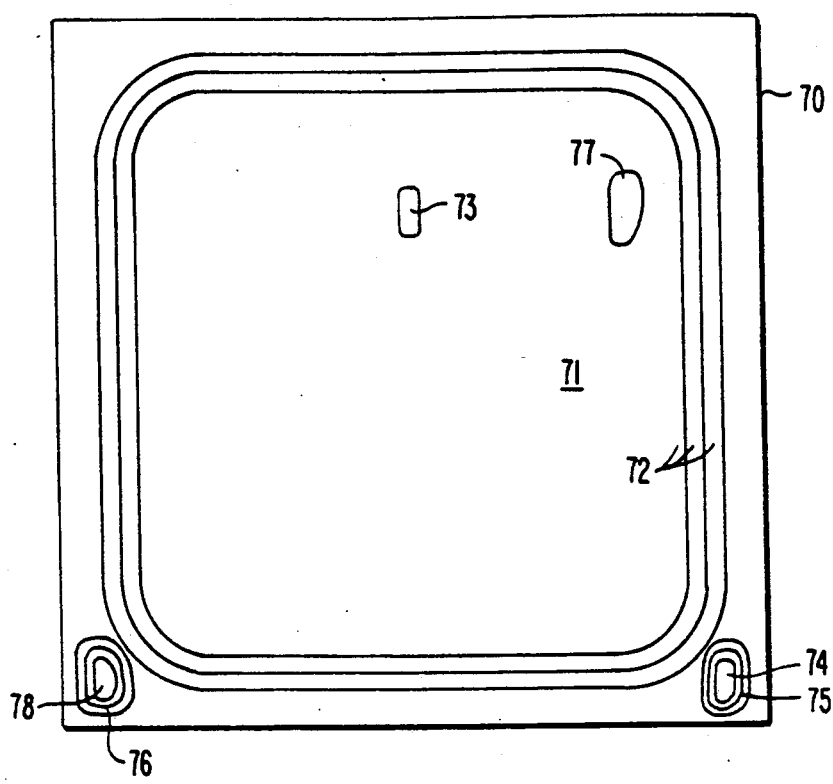
FIG. 7 shows possible locations of the temperature sensing device on a power transistor.

FIG. 7 shows possible locations of the temperature sensing diode (designated 73) on a power transistor chip 70. A power transistor 71 is located on the interior of the chip and is surrounded by guard rings 72 to prevent voltage breakdown. Temperature sensing diode 73 can be placed inside the guard rings with the power transistor. This allows the diode to be close to the hotter portions of the chip for optimum speed in detecting temperature changes. However, the diode will be more susceptible to crosstalk or noise from the power transistor in this location.

In an alternate configuration, the diode designated 74 can be placed in the corner of the chip outside of the guard rings. This part of the chip is not normally utilized, so the diode would not take any space from the power transistor. The diode will be less susceptible to crosstalk or noise when so located, but the diode must be surrounded by guard rings 75 in order to prevent voltage breakdown. Additionally, the diode will be further from the high of temperature areas and may be slower to detect changes in temperature.

Control circuitry that utilizes the temperature sensing diode may also be located on the power transistor chip. This includes, but is not limited to, control circuitry for determining whether the chip has exceeded a designated temperature and control circuitry for turning off the power transistor when the designated temperature is exceeded. Control circuitry 77 may be placed inside guard rings 72 with the power transistor, or inside guard rings 75 with diode 74. In addition, the control circuitry designated 78 may be placed inside guard rings 76 separate from the power transistor or the diode. The connections between the control circuitry and the diode of the power transistor may be placed on the chip if the connections do not need to cross any guard rings. Otherwise, the connections may need to be made external to the chip.

Figure 8:
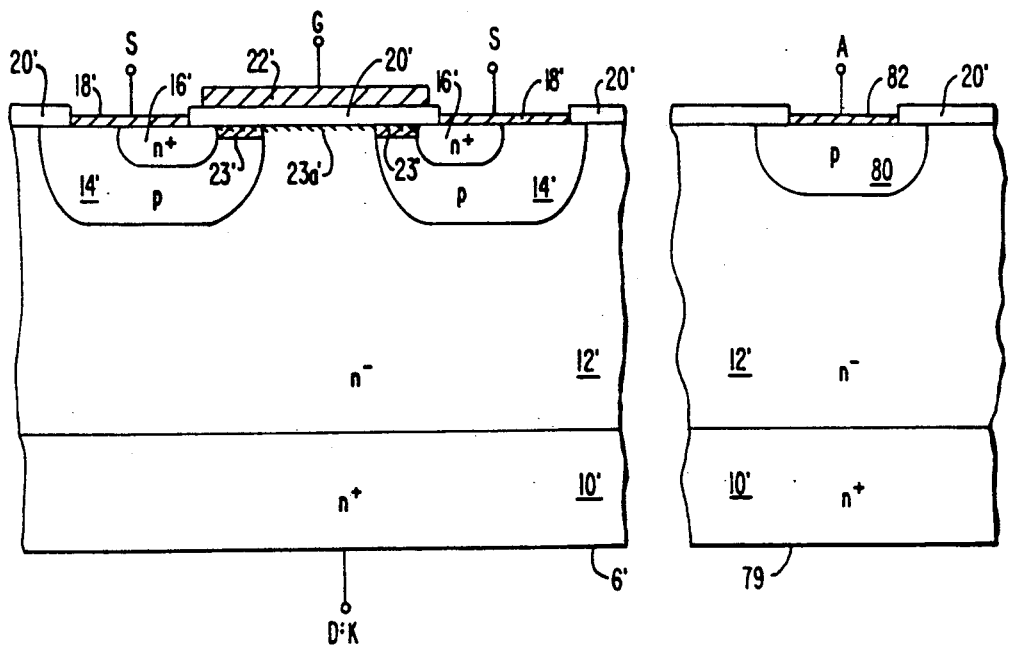
FIG. 8 shows an n channel power MOS transistor with an alternative temperature sensing diode.

FIG. 8 shows an n channel power MOS transistor with an alternative temperature sensing diode. The power MOS transistor, designated 6' is identical to the one shown in FIG. 1. However, the diode designated 80, is of a different construction. The diode consists of a p type anode buried in n− epitaxial layer 12' in which the epitaxial layer acts as both the drain of the power MOS device and as the cathode of the diode. Overlying the anode of the diode is a metallic connection 82 surrounded by silicon dioxide layers 20'.

Because the drain is used as the cathode of the diode, there are fewer parasitic SCRs to be concerned with. However, the diode is no longer isolated from the MOS, so it is susceptible to voltage breakdown. In addition, the diode only works for sensing temperature when the gate is turned ON.

Figure 9:
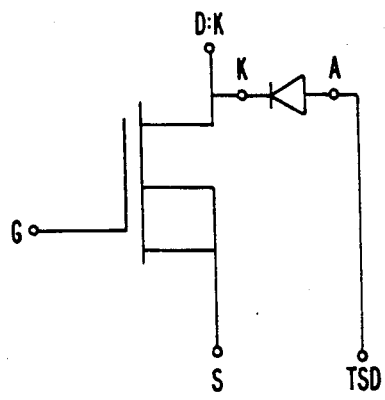
FIG. 9 shows the equivalent circuit symbols for the transistor and the diode, as shown in FIG. 8, with preferred circuit connections.

FIG. 9 shows the equivalent circuit symbols for the transistor and the diode, as shown in FIG. 8, with preferred circuit connections. The cathode of the diode is connected to the drain of the power MOS device. As a result, only four external leads are needed in order to run the power MOS and the temperature sensing diode simultaneously.

Figure 9A:
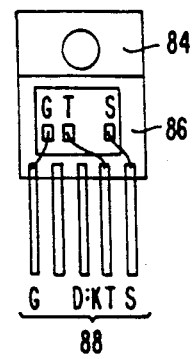
FIG. 9A shows the preferred package for the embodiments described in FIGS. 8 and 9.

FIG. 9A shows the preferred package for the embodiments described in FIGS. 8 and 9. The package is comprised of a heat sink 80 and a body 82 with external leads 84. The power of MOS and the diode are contained in the body of the package.

Figure 10:
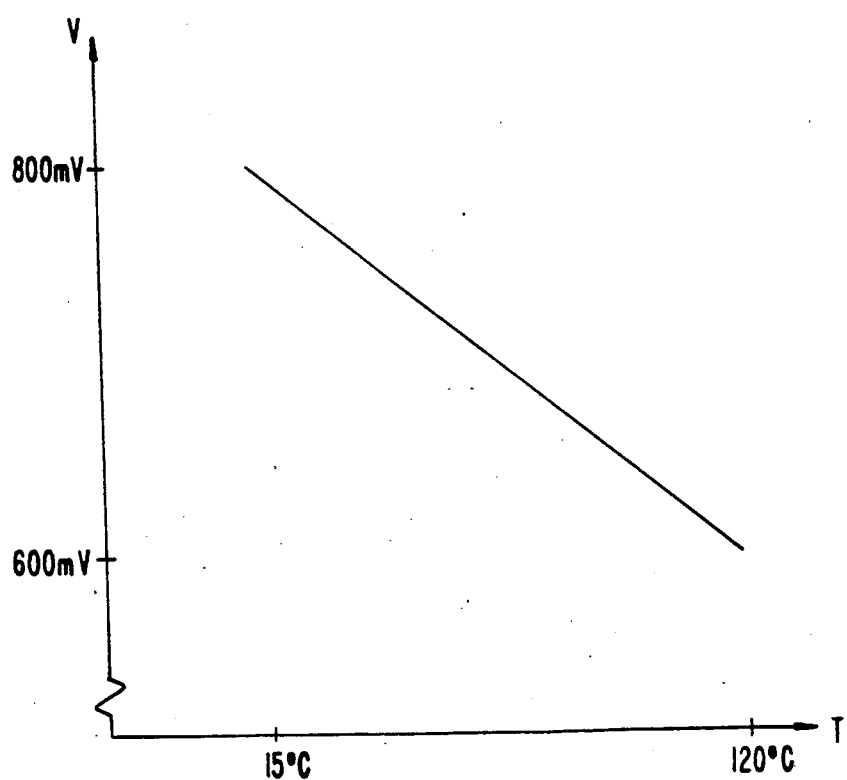
FIG. 10 shows the voltage temperature relationship generated by the diode when a positive bias and a constant current are applied to the diode.

FIG. 10 shows the voltage temperature relationship generated by the diode when a positive bias and a constant current are applied to the diode. As can see be seen as temperature increases the voltage decreases in a linearly proportional relationship. As a result, external control circuitry can more easily determine the actual temperature of the power transistor and take the appropriate corrective action, While the above description provides a full and complete disclosure of the preferred embodiments of the invention, various modifications, alternate constructions, and equivalents may be employed. For example, the diode could be encircled with guard rings while being within the transistor guard rings to prevent crosstalk. For another example, the electrical contacts with the various regions are not required to be aluminum. Accordingly, the above description and illustration should not be construed as limiting the scope of the invention, which is defined by the appended claims.

What is claimed is:

1. A semiconductor power device comprising a power transistor and a temperature sensing diode device for sensing the temperature of the power transistor, the power transistor having a substrate, a first conductivity type epitaxial layer with a first depth, and a first conductivity type source region, the temperature sensing diode device comprising:
   (a) a second conductivity type first diode region with a second depth less than said first depth;
   (b) a second conductivity type second diode region disposed in said first diode region with a third depth greater than said second depth but less than said first depth, and encircled by said first diode region, said second diode region and said first diode region having relatively different doping levels; and
   (c) a heavily doped first conductivity type third diode region for preventing latch-up and being disposed in said second diode region with a fourth depth less than said second depth, and in contact with said first diode region;
   said source region being electrically connected to a region of said diode for preventing voltage breakdown;
   the application of a bias and a constant current to the diode generating a voltage across said diode which varies linearly with the temperature of the power transistor.

2. The semiconductor power device of claim 1 wherein the power transistor is a power MOS transistor.

3. The semiconductor power device of claim 1 wherein the power transistor is a power IGBT.

4. The semiconductor power device of claim 1 wherein the temperature sensing device is encircled by at least one second conductivity type guard ring.

5. The semiconductor power device of claim 1 further comprising a plurality of temperature sensing devices being connected in parallel for detecting the hottest point on the power transistor.

6. The semiconductor power device of claim 1 further comprising control circuitry electrically coupled to the temperature sensing device for providing said bias and said constant current.

7. The semiconductor power device of claim 6 wherein the control circuitry is electrically coupled to the power transistor.

8. A semiconductor power device comprising a power transistor, control circuitry, and at least one temperature sensing diode device for sensing the temperature of the power transistor, the power transistor having a substrate, a first conductivity type epitaxial layer with a first depth, and a first conductivity type source region, the control circuitry being electrically coupled to the power transistor and to the at least one temperature sensing device, comprising:
   (a) a second conductivity type first diode region with a second depth less than said first depth;
   (b) a second conductivity type second diode region disposed in said first diode region with a third depth greater than said second depth but less than said first depth, and encircled by said first diode region, said second diode region and said first diode region having relatively different doping levels; and
   (c) a heavily doped first conductivity type third diode region for preventing latch-up and being disposed in said second diode region with a fourth depth less than said second depth, and in contact with said first diode region;
   said source region being electrically connected to a region of said diode for preventing voltage breakdown;
   the application of a bias and a constant current to the diode generating a voltage across said diode which varies linearly with the temperature of the power transistor.

9. A semiconductor power device comprising a power transistor and a temperature sensing diode device for sensing the temperature of the power transistor, the power transistor having a substrate, a first conductivity type epitaxial layer with a first depth, and a first conductivity type source region, the temperature sensing diode device comprising:

a second conductivity type first diode region with a second depth less than said first depth;

a heavily doped second conductivity type second diode region disposed in said first diode region with a third depth greater than said second depth but less than said first depth, and encircled by said first diode region; and heavily doped first conductivity type third diode region disposed in said second diode region with a fourth depth less than said second depth, and in contact with said first diode region;

said source region being electrically connected to a region of said diode for preventing voltage breakdown.

* * * * *